(12) United States Patent
Kain

(10) Patent No.: US 11,728,809 B2
(45) Date of Patent: Aug. 15, 2023

(54) DISPLACEMENT SENSOR AND SWITCH

(71) Applicant: Aron Z. Kain, Suffern, NY (US)

(72) Inventor: Aron Z. Kain, Suffern, NY (US)

( * ) Notice: Subject to any disclaimer, the term of this patent is extended or adjusted under 35 U.S.C. 154(b) by 93 days.

(21) Appl. No.: 17/424,248

(22) PCT Filed: Jan. 29, 2019

(86) PCT No.: PCT/US2019/015572
§ 371 (c)(1),
(2) Date: Jul. 20, 2021

(87) PCT Pub. No.: WO2020/159477
PCT Pub. Date: Aug. 6, 2020

(65) Prior Publication Data
US 2022/0116037 A1 Apr. 14, 2022

(51) Int. Cl.
*H03K 17/95* (2006.01)
(52) U.S. Cl.
CPC ... *H03K 17/954* (2013.01); *H03K 2017/9527* (2013.01)
(58) Field of Classification Search
CPC .................................................. H03K 17/954
USPC ..................................................... 324/207.11
See application file for complete search history.

(56) References Cited

U.S. PATENT DOCUMENTS

| | | | |
|---|---|---|---|
| 3,066,267 A | 11/1962 | Menhennett | |
| 3,618,376 A | 11/1971 | Shull et al. | |
| 3,636,752 A | 1/1972 | Ishii | |
| 3,909,713 A | 9/1975 | Billeter | |
| 4,064,744 A | 12/1977 | Kistler | |
| 4,237,989 A | 12/1980 | Lewis | |
| 5,261,278 A | 11/1993 | Kain | |
| 5,546,806 A | 8/1996 | Kain | |
| 7,296,485 B2 | 11/2007 | Kain | |
| 2007/0119266 A1* | 5/2007 | Kain | ........................ G01L 1/14 73/862 |
| 2012/0081106 A1 | 4/2012 | Grinberg et al. | |
| 2017/0370694 A1* | 12/2017 | Yoshida | ................... G01B 7/14 |
| 2018/0113005 A1 | 4/2018 | Selvaraj et al. | |

FOREIGN PATENT DOCUMENTS

KR 10-2017-0044483 A 4/2017

OTHER PUBLICATIONS

International Search Report and Written Opinion dated Oct. 29, 2019, from PCT/US2019/015572, 16 sheets.
Notice of Allowance dated Jul. 18, 2007, from U.S. Appl. No. 10/582,023, 14 sheets.
International Search Report and Written Opinion dated Aug. 25, 2006, from PCT/US2005/005442, 4 sheets.

(Continued)

*Primary Examiner* — Tomi Skibinski
(74) *Attorney, Agent, or Firm* — Katten Muchin Rosenman LLP

(57) ABSTRACT

Disclosed herein is a sensor having an extended sensing distance range beyond conventional proximity sensors. The sensor includes an electrical component structure having a topology in which current is concentrated close to a periphery of the electrical component to produce an extended sensing field. A frequency adjustment circuit can be used to control a frequency of the sensing field to avoid jammers or other interfering signals.

19 Claims, 12 Drawing Sheets

(56) References Cited

OTHER PUBLICATIONS

International Preliminary Report on Patentability dated Nov. 1, 2006, from PCT/US2005/005442, 4 sheets.
J. Sathyasree, et al.; "Compact Modeling of Proximity Effect in High-Q Tapered Spiral Inductors", IEEE Electron Device Letters, vol. 39, No. 4, Apr. 2018, pp. 588-590, 3 sheets.
T. Mizuno, et al., "Extending the Operating Distance of Inductive Proximity Sensor Using Magnetoplated Wire", IEEE Transactions on Magnetics, vol. 45, No. 10, Oct. 2009, pp. 4463-4466, 4 sheets.
Manfred Jagiella, et al., "Progress and Recent Realizations of Miniaturized Inductive Proximity Sensors for Automation", IEEE Sensors Journal, vol. 6, No. 6, Dec. 2006, pp. 1734-1741, 8 sheets.

\* cited by examiner

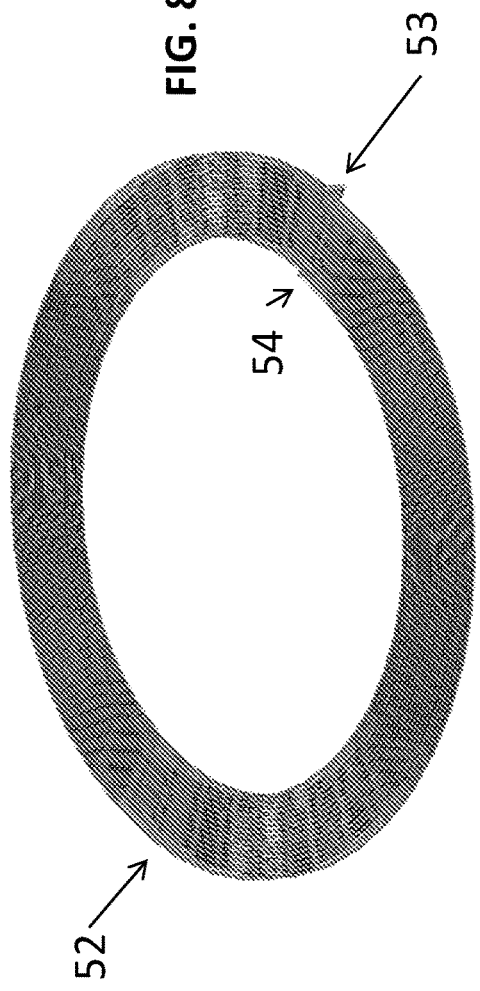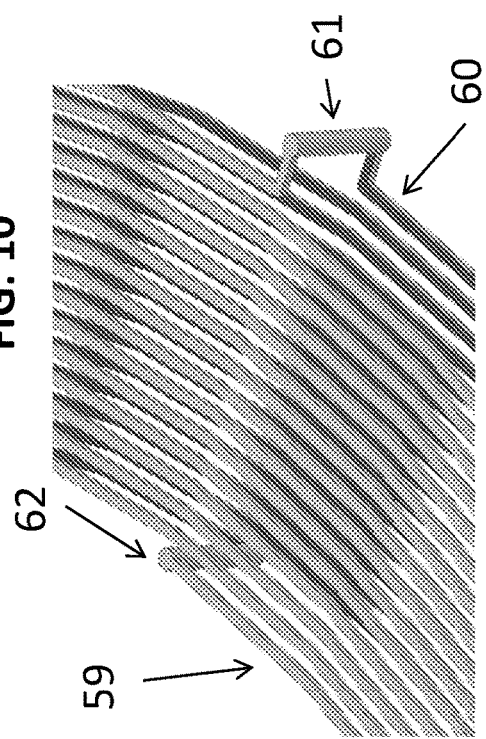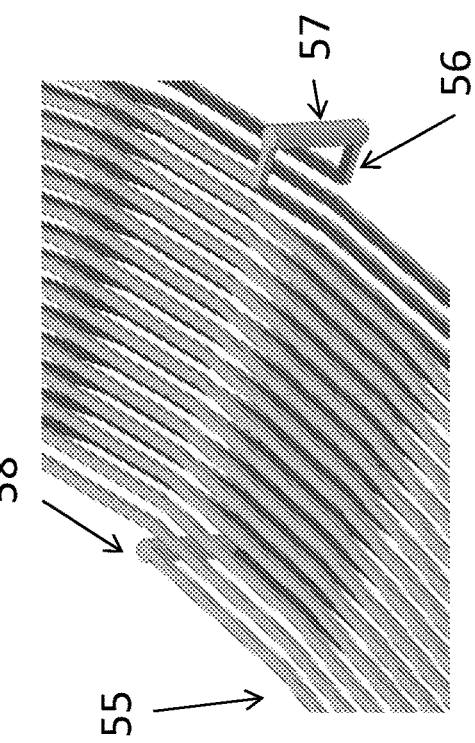

DISPLACEMENT SENSOR AND SWITCH

FIELD OF THE INVENTION

The present invention relates to displacement measuring transducers, and more particularly to physical parameter sensors, that include, but are not limited to, proximity sensors, pressure sensors, temperature sensors, force sensors, displacement sensors, load cells, accelerometers, torque sensors, and flow sensor devices. Even more particularly, this invention relates to a proximity sensor monitoring a displacement of a physical component present in an electromagnetic field according to the effect of the displacement on perturbing the field. It will be appreciated by those skilled in the art that this invention equally relates to tilt sensors, inclinometers, rotary sensors, and linear displacement sensors, as these all fall under the umbrella of proximity sensing, the sensing of one object in relation to another, using the enclosed described invention in appropriate form and function.

BACKGROUND

Proximity measuring transducers, such as proximity sensors, are well known in the arts. Many different sensing technologies have been used in proximity transducers, such as inductive sensing, capacitive sensing, optical sensing, and ultrasonic sensing. These sensing technologies are also well known in the arts. Inductive proximity sensors usually contain an inductive element that generates a magnetic field which in turn is disturbed by a metallic target in close proximity to the inductive element—hence the term proximity sensors. The inductive element is typically one or even two wire-wound, ferrite loaded coil bobbins suitably arranged so that the magnetic field generated by the current that flows within the bobbins is modified by the presence of a target. These types of constructed devices typically suffer from relatively high temperature dependence, are difficult to assemble, and require hand tuning of their structures for repeatable operation from device unit to device unit.

Numerous improvements have been made over the years resulting in one particular embodiment of proximity sensor design that includes the use of a single or multiple planar spiral inductors as taught by Kain in U.S. Pat. No. 7,296,485. Kain discloses using a novel approach of perturbing an electromagnetic field rather than the conventional static magnetic field to gain a significant advantage over conventional displacement sensors, which include inductive proximity sensor designs, in performance, construction, and manufacturability. However, Kain, as well as all other inductive proximity sensor approaches, suffer from a relatively limited sensing distance range, electromagnetic interference effects, and signal jamming effects.

SUMMARY

In accordance with the principles of the present invention, the preferred embodiment produces a sensor with a significantly extended sensing distance range beyond conventional proximity sensors.

Another advantage of the present invention is its inherent electromagnetic interference immunity, even at levels greater than 200V/m.

Another advantage of the present invention is the ability to resist jamming signals that would typically render a conventional proximity sensor and switch inoperable.

It is still another advantage of the present invention to allow for the use of any material as a target candidate whether it is metal, semiconductor, or insulator.

It is still another advantage of the present invention to allow the sensor to be used ubiquitously as in the implementation of Internet of Things, and be cyber secure, immune to hacking and unwanted control by a third party.

It will be apparent to those skilled in the art that the preferred embodiment of the invention, as taught herein, will indicate many more advantages in the performance, functionality, manufacturability, and production of these sensors and switches beyond those mentioned above.

BRIEF DESCRIPTION OF THE DRAWINGS

FIGS. 8-12 depict isometric views of the enhanced sensing distance structure.

DETAILED DESCRIPTION

Figure 1:
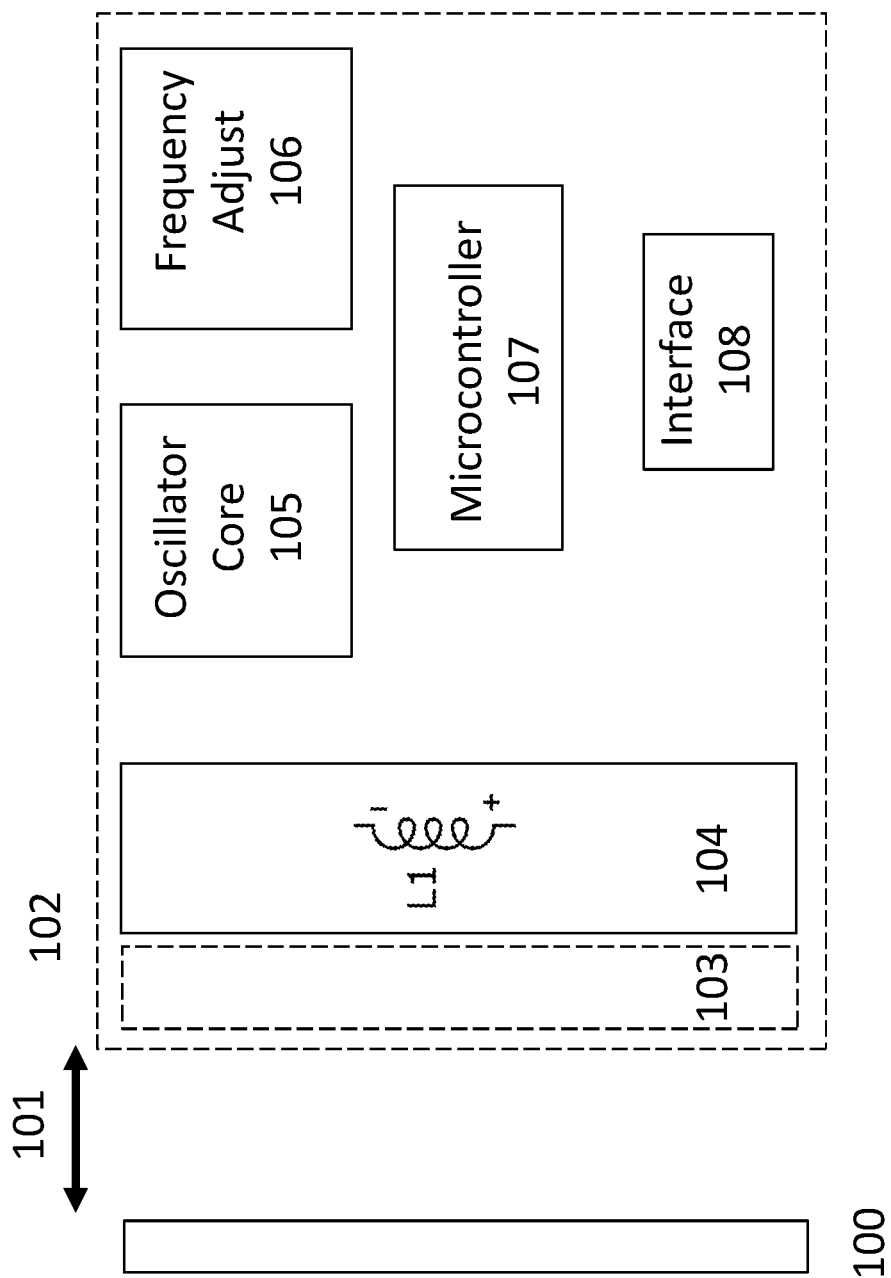
FIG. 1 depicts a schematic diagram showing an embodiment of the present invention.

In accordance with the principles of the present invention, a proximity measuring transducer is disclosed that operates by measuring a physical displacement effect. The proximity measuring transducer includes a physical component, an electrical component structure that produces an electromagnetic (EM) field in response to an applied radio frequency signal, and a monitoring circuit for monitoring an output signal affected by the EM field to detect an operation of the sensing device according to a change in the output signal. The physical component ("target") whose proximity is to be measured is positioned in proximity to the EM field generated by the electronic component structure, such that it perturbs the EM field without physically contacting said electrical component structure. A displacement of the physical component results in a change to the perturbation of the EM field, and thereby, to a change in the output signal. The displacement may take many forms such as linear (forward/backward, side-to-side, or combination thereof), rotational (full or partial 360° angular presentation of the target to be sensed), or any proscribed motion described by the usual 6 degrees of freedom associated with the description of displacement. The displacement may be caused by any means necessary, including but not limited to, pressure, force, acceleration, flow, and torque allowing the preferred embodiment to be transformed from a proximity sensor to, for example, a weighing load cell, with the addition of appropriate mechanical displacement structures in proximity to the sensor's EM field generating electronic component.

A variety of well-known electrical component structures may be used to generate and sense the EM field and its perturbation. For example, planar pancake coils, (single and multiple layer stacked coils), planar inductive coil transformers, interdigitated capacitors, and distributed transmission structures (e.g., transmission lines, antennas and other structures formed having transmission path lengths that are a predetermined fraction or multiple of an associated operating frequency wavelength) may be employed in various circuit configurations as resonators, filters, impedance matching networks, and the like. *

The physical component can be made from a great variety of materials so long as the characteristic of the selected material will perturb the EM field. For example, suitable materials may be found to include metals, plastics, wood, ceramics, frozen liquids, brick, and biological materials (for example, such as bone). The monitoring circuit may operate to convert the sensed perturbed EM field into an amplitude, frequency, phase, electrostatic signal, magnetostatic signal, or combination of these to sense the effect of the perturbed EM field.

The present invention significantly differs from existing state of the art inductive proximity sensors in that it operates using multiple frequencies and an EM perturbation principle using advanced structures that enhance the EM field at a greater distance from the sensor face thereby significantly increasing the sensing distance and providing the other advantages as indicated above. The significance of the invention's operating principle of EM perturbation can be greatly appreciated by those skilled in the art. For example, the invention does not require the use of ferrite material to affect the measurement as conventional devices do. This eliminates the need for hand coil winding, susceptibility to magnetic fields, the need to remove close proximity metals to increase the detection range, and hand assembly of the transducer, as conventional sensors require. This, in turn, allows the invention to be highly automated in construction, reducing manufacturing costs significantly, and allows the invention to have far superior performance characteristics. As one specific example, the invention has anywhere from 1.5 to 4× the range of conventional sensors of comparable sizing configuration. As another significant example, while conventional individual sensors are sensitive to the type of material construction of the sensed object, i.e. the material correction factor for proximity, which can vary by up to 80%, this invention has no need for a correction factor as it is insensitive to the type of metallic material sensed. This inventions' output signal, and hence, proximity measurement, is insensitive to the detected object construction material whether it is aluminum, steel, brass, or copper. All metals give the same proximity range regardless of material construction.

It is well known that the sensing distance of a proximity sensor is directly related to the Q of the device, ["Progress and Recent Realizations of Miniaturized Inductive Proximity Sensors for Automation", Manfred Jagiella, Sorin Fericean, Albert Dorneich, IEEE SENSORS JOURNAL, VOL. 6, NO. 6, DECEMBER 2006, PP. 1734-1741] where the Q is the ratio of the stored energy in the magnetic or electric field and the resistive loss in the metal that makes up the inductive structure. Mathematically this is expressed as:

$$Q_L = \frac{\omega \cdot \sum_{i=1}^{n} \mu_i \int\int\int_l H_i(p) \cdot H_i^*(p) dv}{\sum_{i=1}^{n} \frac{t}{\sigma_i} \int\int\int_l J_i(p) \cdot J_i^*(p) dv} \quad (1)$$

In the case of an inductor, Q can be expressed in the more familiar formulation of $$Q_L = \frac{\mathcal{J}\bar{Z}}{\mathcal{R}\bar{Z}} = \frac{\omega \cdot L}{R_s} \quad (2)$$

Where L is the inductance which stores the field energy, ω is the frequency of operation, and R is the total resistance of the inductor's conductor material. Conventional proximity sensor design, whether bobbin based or planar coil based, optimizes the Q by reducing R. In this case, some increase in sensing distance range is achieved.

Much research has been devoted to increasing the Q, and thereby increasing the sensing distance with marginal success. Planar spiral inductors have been developed that taper in width as they increase in the size of the spiral ["Compact Modeling of Proximity Effect in High-Q Tapered Spiral Inductors" J. Sathyasree; Venkata Vanukuru; Deleep Nair; Anjan Chakravorty IEEE Electron Device Letters, Page(s): 588-590 Volume: 39 Issue: 4 Publication Year: 2018], and special wire wrapping schemes have been developed to reduce resistive losses ["Extending the Operating Distance of Inductive Proximity Sensor Using Magnetoplated Wire", T. Mizuno, et al, IEEE TRANSACTIONS ON MAGNETICS, VOL. 45, NO. 10, OCTOBER 2009].

One alternative approach to attempt to increase sensing distance has been to use a secondary coil so that a transmitting and receiving coil arrangement is realized which eliminates the reliance on Q as the determining factor in sensing distance range [https://www.turck.us/static/media/downloads/more11500e.pdf]. However, each coil in this dual coil approach, both the primary and secondary coil, are optimized by taking into consideration the Q of the respective coil. All these attempts have had limited success with necessary tradeoffs in functionality, performance, and/or manufacturability.

In the case of planar spiral inductors, the focus has been on increasing Q by reducing the inductors' resistance since a higher Q also benefits the integrated semiconductor and communications industry, with an increased sensing distance for proximity sensors as a complimentary byproduct.

However, the focus for increasing the sensing distance has been on the wrong element of Q. Increasing the Q by reducing the resistance of the inductive element only marginally increases the sensing distance because the key to sensing distance has not been addressed, that of having the field itself extended further out from the sensor face. It is the interaction of the field with the target that ultimately forms the sensing element, not the implementation in the sensing circuit by reducing the resistance. One can reduce the resistance of the inductance to zero, such as in a superconductor spiral inductor, and still not achieve significant sensing distance range increase.

The embodiment of FIG. 1 shows the key elements that make up this advanced displacement sensor. The target 100 that is being sensed by the displacement sensor 102 is positioned such that it can move within the detection range 101 of the sensor 102. The sensor 102 generally comprises EM field responsive component 104, such as a planar spiral inductor of enhanced sensing range as taught herein, an oscillator core 105 that energizes the EM field responsive component 104, a frequency adjustment component 106 that allows the sensor 102 to operate at multiple independent frequencies, controlled by a digital controller such as a microcontroller 107, and interface 108 circuitry to provide input and output signals to any desired outside electronics for the end user to use. In this embodiment, the oscillator core 105 provides a digital frequency changing output signal that is proportional to the position of the target 100 in relation to the EM field responsive component 104. The microcontroller 107 samples this output signal and provides the proper evaluation of the target 100 displacement. A selective field suppression component 103 may be optionally employed to allow the EM field responsive component 104 to selectively measure metal or dielectric targets 100.

EM field responsive component 104 may be chosen from numerous types of structures. For illustration herein, EM field responsive component 104 is depicted as a planar spiral inductor, although any of the previously mention EM generating structures can be used. By realizing that it is not the Q that dramatically can increase the sensing range but rather optimizing the numerator of equation 2 for the field energy, significant sensing range increase can be achieved.

Figure 3:
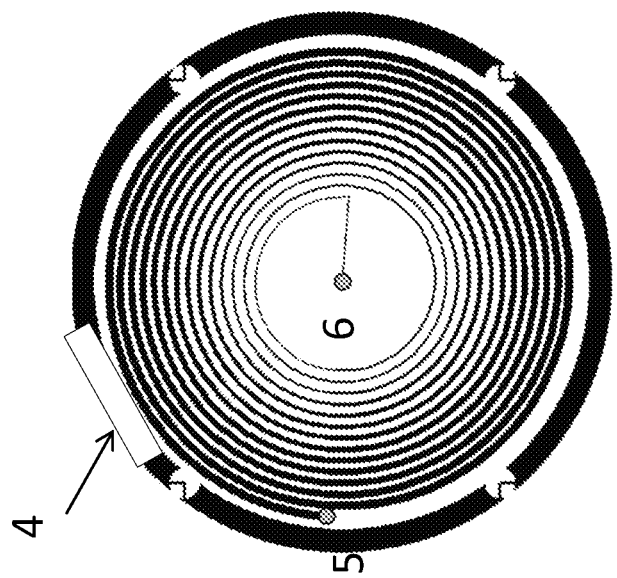
FIGS. 2-3 depict plan views of prior art sensing distance structures.
Figure 2:
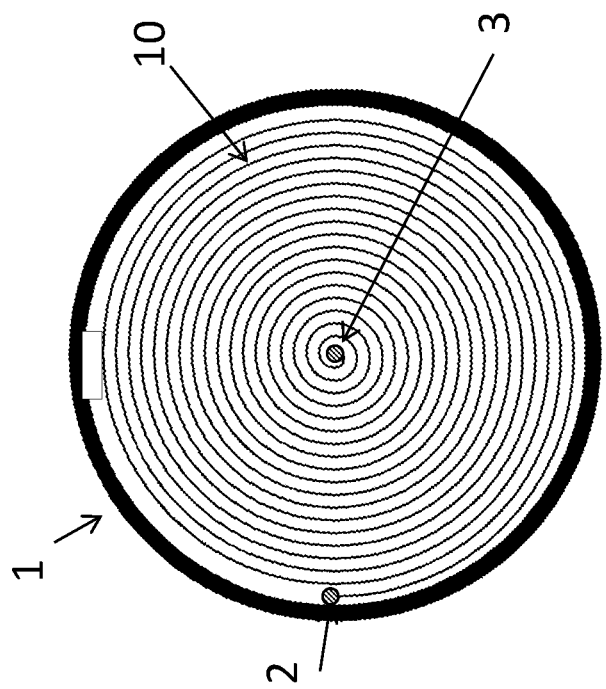
Figure 4:
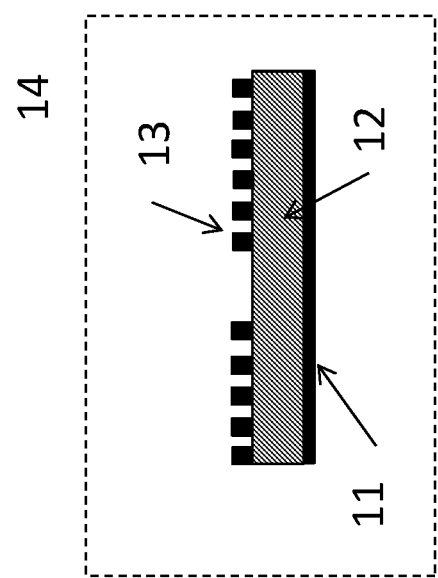
FIG. 4 depicts a plan view of an enhanced sensing distance structure according to the present invention.

Referring next to FIGS. 2-3, a conventional spiral inductor 1 has an input 2 and an output 3. Notice the conductive traces 10 are all uniform in width. The outer turns of the spiral are the longest length and therefore contribute the most resistance to the spiral's overall resistance. By using the tapered spiral shown in spiral inductor 4, where the conductive traces now gradually increase their width as the traces spiral out towards the edge, the resistance of the wider traces and longer length turns is reduced thereby lowering the total resistance of the coil. In fact, measurements reveal that while the Q of 1 is approximately 10, the Q of 4 is >40, but there is only a marginal increase in sensing distance. However, as taught herein, the focus is on the numerator of equation 2 rather than on the resulting Q of the spiral, which is counterintuitive to conventional wisdom. As such, the compact coil 7, with non-tapered traces, and input 9 and output 8, will have a much lower Q as the turns are compacted and concentrated towards the outer diameter of the compact coil 7, leading to a much greater coil length and hence vastly increased resistance. However, by crowding the traces together, the current is concentrated in this area and yields an increase in the overall EM field's sensing distance by essentially focusing the field. As such, the stored energy of the structure, the numerator of equation 1, is vastly increased although the Q will be reduced dues to the contribution of a much larger R. All the coils in FIGS. 2-4 are constructed using the cross-sectional view 14 which comprises ground plane 11, a substrate of dielectric material (such as FR4, a glass-reinforced epoxy laminate material) 12 and the coil structure 13. The ground plane 11 and coil structure 13 can be made of any suitable metal. The ground plane 11 can also be patterned rather than a solid sheet. This patterned ground is advantageous to reduce image currents generated by the coil. There are many such patterned ground plane designs and they are well known in the arts ["High-Q Spiral Inductors with Multilayered Split-Ring Resonator (SRR) Patterned Ground Shields", A. Sahu, et al, 2014 IEEE Antennas and Propagation Society International Symposium (APSURSI)].

Since the extended sensing range is dependent on the EM field, and we are interested in extending the EM field as far as possible from the sensor face, many topological implementations of the aforementioned spiral inductor are useful. For example, the planar spiral inductor 7 can be combined with discrete capacitors to form a resonant circuit at an arbitrary frequency. Also equally valid in order to maximize the EM field extension is to use the planar spiral inductor 7 in its self-resonant mode where no external capacitance is required. This self-resonant mode has the added advantage that since the parasitic capacitance, which allows the resonance to occur, is typically very low, a greater amount of energy is dumped into the inductor to allow the EM field to extend further out. Additionally, multiple planar spiral inductors 7 may be stacked so that an arbitrary number of coils can be connected together in series or parallel to achieve the desired effect of extending the EM field range. With the realization that it is the field that needs to be optimized and not the Q, as conventional wisdom teaches, it will be appreciated by those skilled in the art that very many topologies can be constructed through both analytical and/or experimental design developments.

For curvilinear type topologies such as the spiral inductor shown as the preferred embodiment of FIG. 2, there are general guidelines for achieving the enhanced sensing distance as taught herein. The substrate thickness to coil diameter ratio (t/d) should be kept at 0.2, the linewidth to spacing ratio should be approximately 0.5, and the number of turns should be such that the ratio of inner diameter to outer diameter be approximately 0.8. By increasing the spacing to linewidth ratio the intensity of the EM field is less concentrated at the center and reduces the sensing distance. Similarly, by reducing the t/d ratio, both the inductance is reduced and the EM field is "squeezed" between the traces and ground plane, also reducing the extent that the EM field extends from the traces towards the desired target for measurement. The preferred embodiment has been optimized for performance by both finite element analysis for electromagnetic behavior as well as thru experimentation. It will be appreciated by those skilled in the arts that other topologies such as meander lines, planar transformers, and interdigitated devices, to name a few, will have their own set of optimized parameters based upon application chosen linewidths, spacing, thickness, and overall dimensions.

Figure 6:
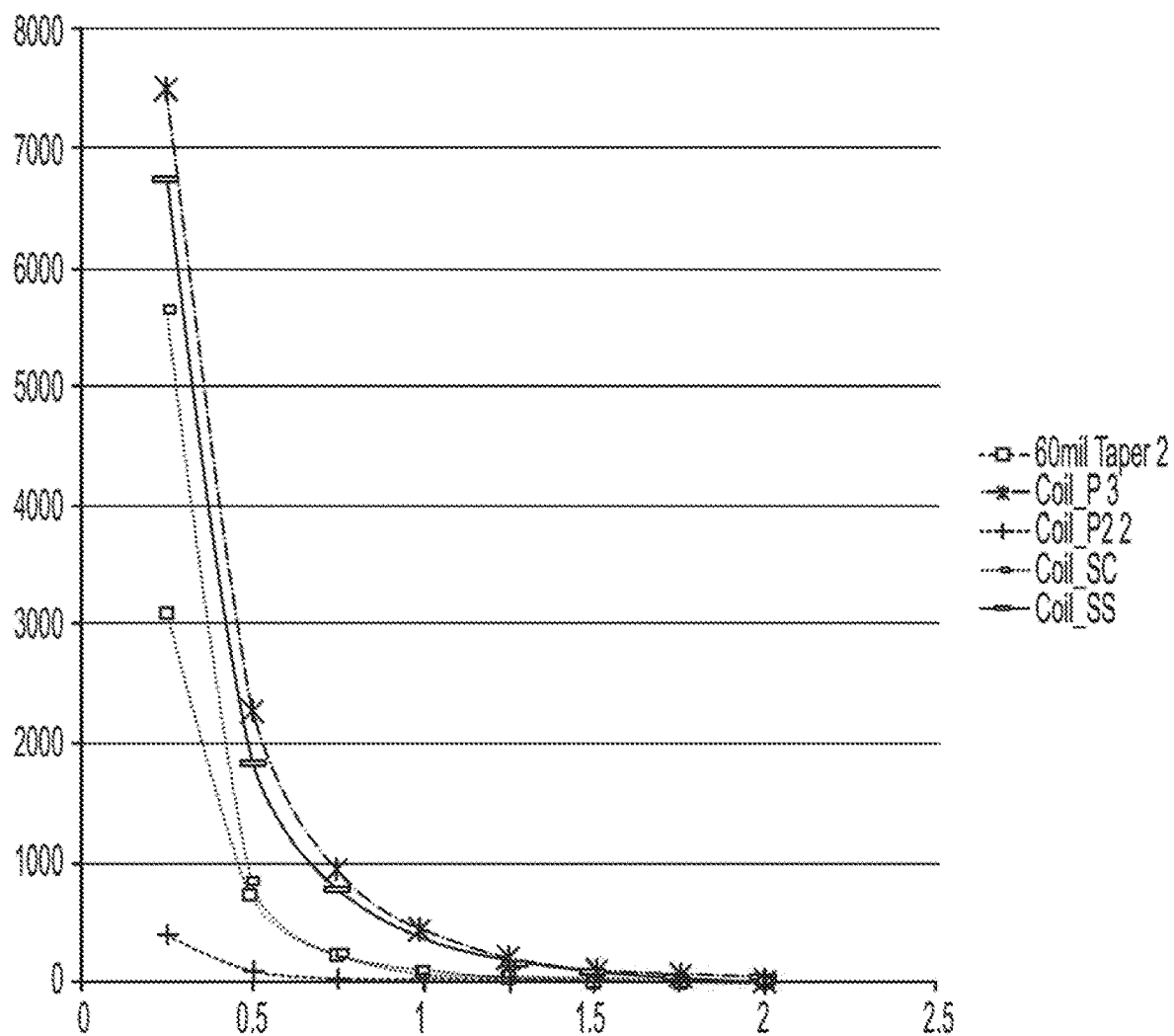
FIG. 6 depicts a chart showing the enhanced sensing distance of the enhanced sensing distance structure compared to the prior art sensing distance structures.

The appreciable increase in sensing distance due to the preferred embodiment of the coil design 7 compared with prior art designs is depicted in the chart of FIG. 6. FIG. 6 shows the distance measurement along the abscissa (in inches) and the change in frequency along the ordinate (in Hz) for coils 4 and 7 in different configurations. The change in frequency is normalized to the topology's nominal oscillating operating frequency when the target is located very far away—at least 6 times the sensor diameter—so that the proximity sensor is operating with essentially no target present. The nominal operating frequency for all topologies in FIG. 6 is approximately 6 MHz.

Figure 7:
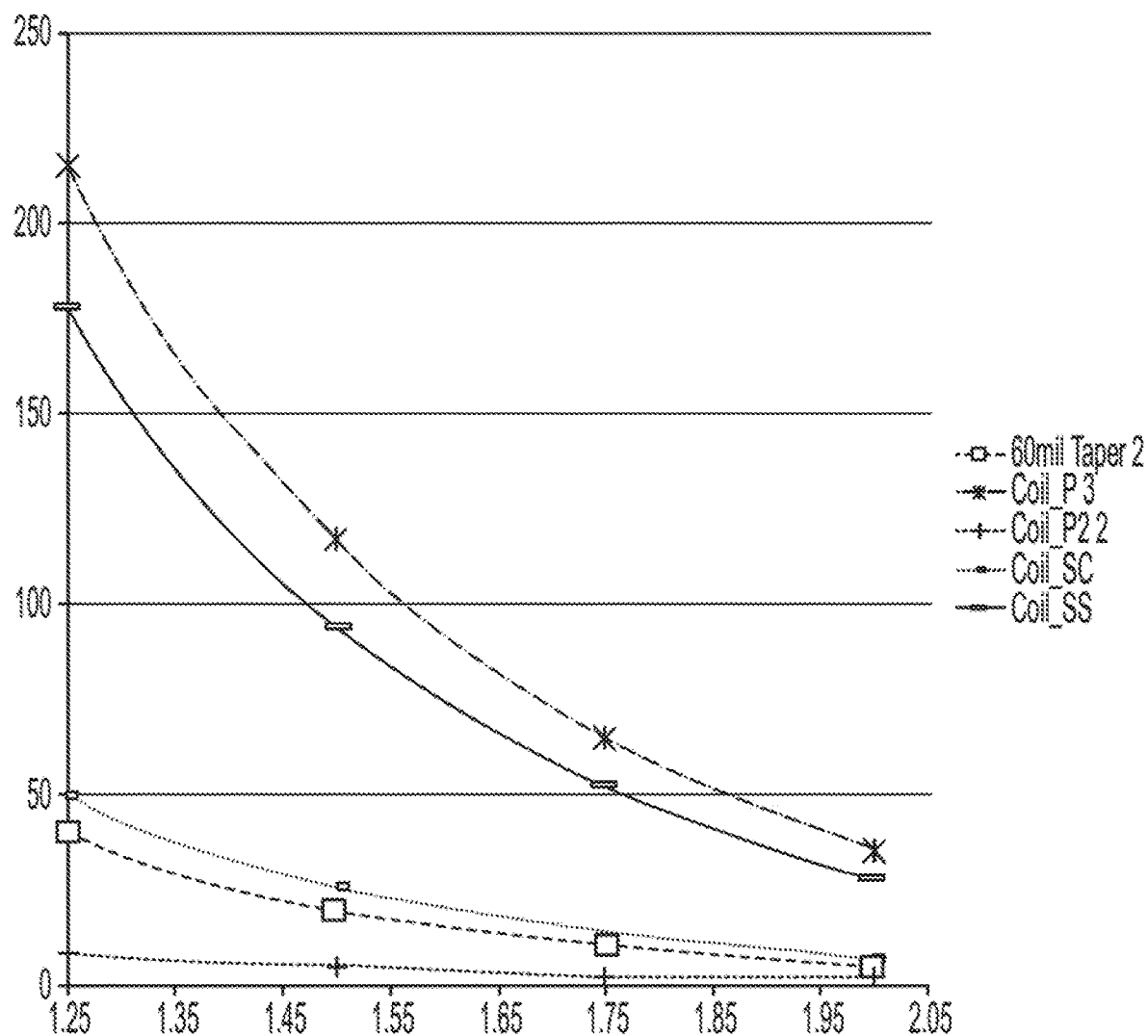
FIG. 7 depicts an enhanced view of a section of the chart of FIG. 6.
Figure 12:
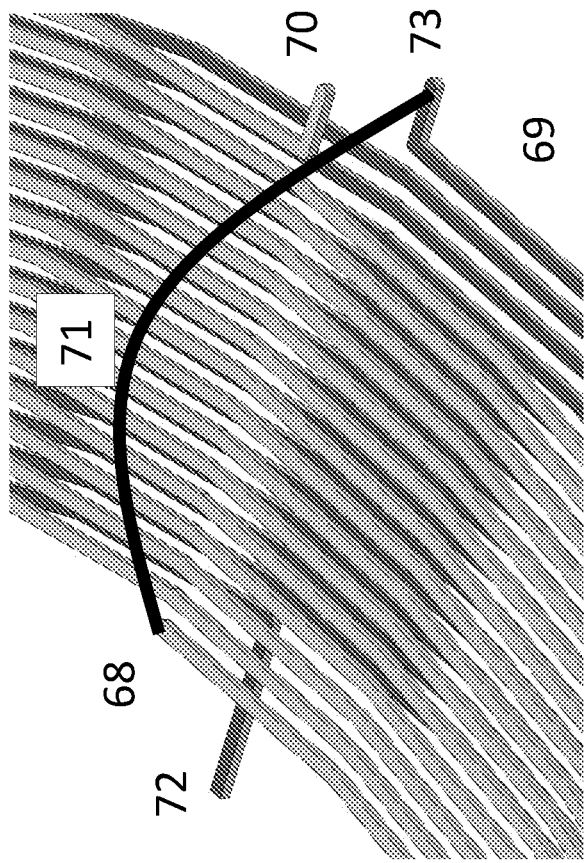

In the embodiment of coil 7 measured in FIG. 6, the coil had a diameter of 2 inches, a linewidth of 6 mils for the coil, a spacing of 10 mils between turns of the coil, an inner diameter of 1.6 inches, and a substrate thickness of 0.250" on FR4 material. The overall change in frequency is shown for a target displaced from 0.25" above the sensor face outward to 2" away. A zoomed in view of the chart of FIG. 6 is depicted in FIG. 7 where the target is displaced from 1.25" to 2" away from the sensor face. The frequency is shown in units of 10 Hz so that 100 units (counts) represents an actual frequency shift of 1 KHz.

The conventional state of the art spiral inductor 1, having a Q of 4, is shown as "60 mil Taper 2" in the graph in FIG. 7. As can be seen, a target at 2" away from the sensor face results in a frequency shift of 20 Hz (2 counts on the graph of FIG. 7) for "60 mil Taper 2" with a change in frequency of up to 400 Hz (40 counts on the graph of FIG. 7) as the target approaches 1.25" away from the sensor face.

"coil_P 3" and "coil_P2 2" represent embodiments of the preferred spiral inductor 7 in a stacked arrangement. As can be seen, a target at 2" away from the sensor face results in a frequency shift of 400 Hz (40 counts on the graph of FIG. 7) for "coil_P 3" with a change in frequency of up to 2200 Hz (220 counts on the graph of FIG. 7) as the target approaches 1.25" away from the sensor face. In essence, "coil_P 3" can be thought of as either (1) extending the sensing range for the same number of counts since "60 mil Taper 2" senses a target at 1.25" for a change in frequency of 400 Hz, while "coil_P 3", for the same change in frequency of 400 Hz, can sense all the way out to 2", or (2) for the same sensing distance "coil_P 3" has an increased sensitivity of 5.5× better than "60 mil Taper 2" from 400 HZ to 2200 Hz when a target is 1.25" away. Of course, better sensitivity is preferable when a specific target distance is required so that environmental and measurement errors such as temperature, jitter, mechanical movement uncertainty, have much less of an effect on the uncertainty of the overall sensed distance. Similarly, where environmental and measurement errors are not much of a concern, simple, raw, target sensing distance is preferable. Referring back to the curvilinear geometry topology specifically, FIG. 8 shows stacked coil 52 with input 53 and output 54. "coil_P 3" is arranged such that top coil 55 and bottom coil 56 are separated by 0.0625" thick FR4 material as depicted in FIG. 9. Each coil is connected at two places via connection points 57 and 58. Coils 55 and 56 are arranged so that their traces run parallel to each other.

Figure 11:
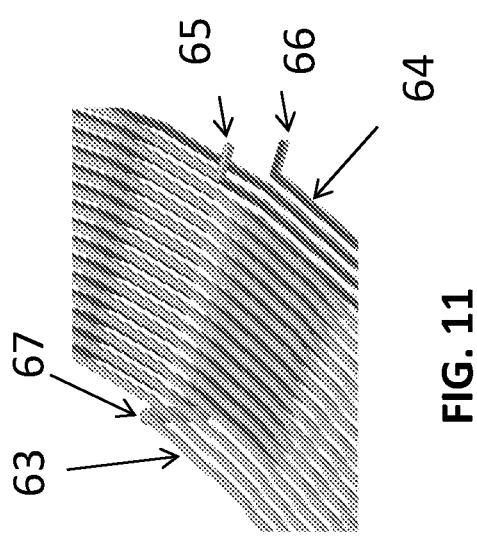

"coil_P2_2", depicted In FIGS. 10-11, is arranged such that top coil 59 and bottom coil 60 are also separated by 0.0625" thick FR4 material. Each coil is connected at two places using connection points 61 and 62. Coils 59 and 60 are arranged so that their traces run anti-parallel to each other; they spiral in opposite directions. As expected, having two coils parallel to each other results in a total inductance of ½ the single coil as well as ½ the resistance so that the Q of the structure remains the same. The Q is still 4 times less than the Q of "60 mil Taper 2", for both "coil_P 3" and "coil_P2 2". However, those skilled in the art will notice that "coil_P 3" and "coil_P2 2" behave vastly differently. "coil_P 3" exhibits an increase in sensitivity, and hence sensing range, of greater than 4 times "60 mil Taper 2"; while "coil_P2 2" performs significantly worse than "coil_P 3" (even though both coils exhibit the same Q). This is readily explained by the second factor that is used to increase sensing distance, which is not accounted for by Q; that of current phase in the coils. As current courses through the inductor it is important to keep any parallel current paths in phase with each other so that the fields generated by the current add positively and enhance each other through the well-known principle of superposition. As such, current and hence, EM field, is enhanced in the structure where 55 and 56 have the current shared between them in phase, resulting in the increased sensing distance. On the other hand, in the structure where coils 59 and 60 have the current shared between them traveling in opposite directions, such that the EM fields generated by the currents are significantly out of phase with each other, the sensing distance is greatly reduced as seen in FIG. 3. Those skilled in the art will appreciate that enhanced sensing distance is not always desired so that purposefully suppressing the sensing distance also has its application advantages.

Phasing of the current provides a means of engineering the desired design of sensing distanced for a particular application. It will also be appreciated by those skilled in the art, that current phasing, as taught herein, can be accomplished and/or enhanced by electronic means as well. For example, by connecting a varactor diode, or similar component that has an associated phase delay (lag or lead), to either coil 60 or 59, electronically induced current phasing can be introduced to create a variable current phase relationship between the coils at the users design discretion. Similarly, this current phasing tuning of the sensing distance design capability, as taught herein, holds true for the self-resonant case where the stacked coils are put in series rather than parallel.

"coil_SC" and 'coil_SS", whose measurement results are depicted in FIGS. 6-7, represent two stacked coils connected in series with each other operating in their self-resonant mode, so that a distributed standing wave is generated along the overall length of the continuous coil trace. "coil_SS", depicted in FIG. 11, is conventionally wired so that current is fed into the top coil 63 at 65 and spirals inward towards the end of the top coil at connection point 67. The current then continues onto the bottom coil 64 at connection point 67 and spirals outward towards the outer edge of the stacked coil and is output at a node on the bottom coil at the edge of the sensor 66.

"coil_SC" is wired so that so that current is fed into the top coil 68 at connection point 70 and spirals inward towards the end of the top coil. The current then crosses over the coil via an airbridge 71 back towards connection point 70 and connects to the bottom coil through a via onto the bottom coil at connection point 69. The current then again spirals inwards toward position 72 on the bottom layer where it is output. Hence, current in both top and bottom coil travel in the same direction (spiraling inward) for "coil_SC". As can be seen from FIGS. 6 and 7, "coil_SS" has a much greater sensing range than "coil_SC". This again is explained by the relative current phase of each coil (top and bottom) at any cross section location. For example, for "coil_SS" the current will have 0° phase difference between 65 and 66 and at 67 where they join. However, "coil_SC" will have 180° phase difference between 70 and 73 as well as between 68 and 72. This 180° phase difference results in a significantly lower sensing range for "coil_SC" as seen in 50. It should now be clear that, as taught herein, significant sensing distance increase is possible by (1) maximizing the EM field by analytical and/or experimental topology choices and (2) ensuring that the phase of the current flowing through the topology is maintained as complementary between overlapping structural components if stacked 3D structures are used.

Figure 16:
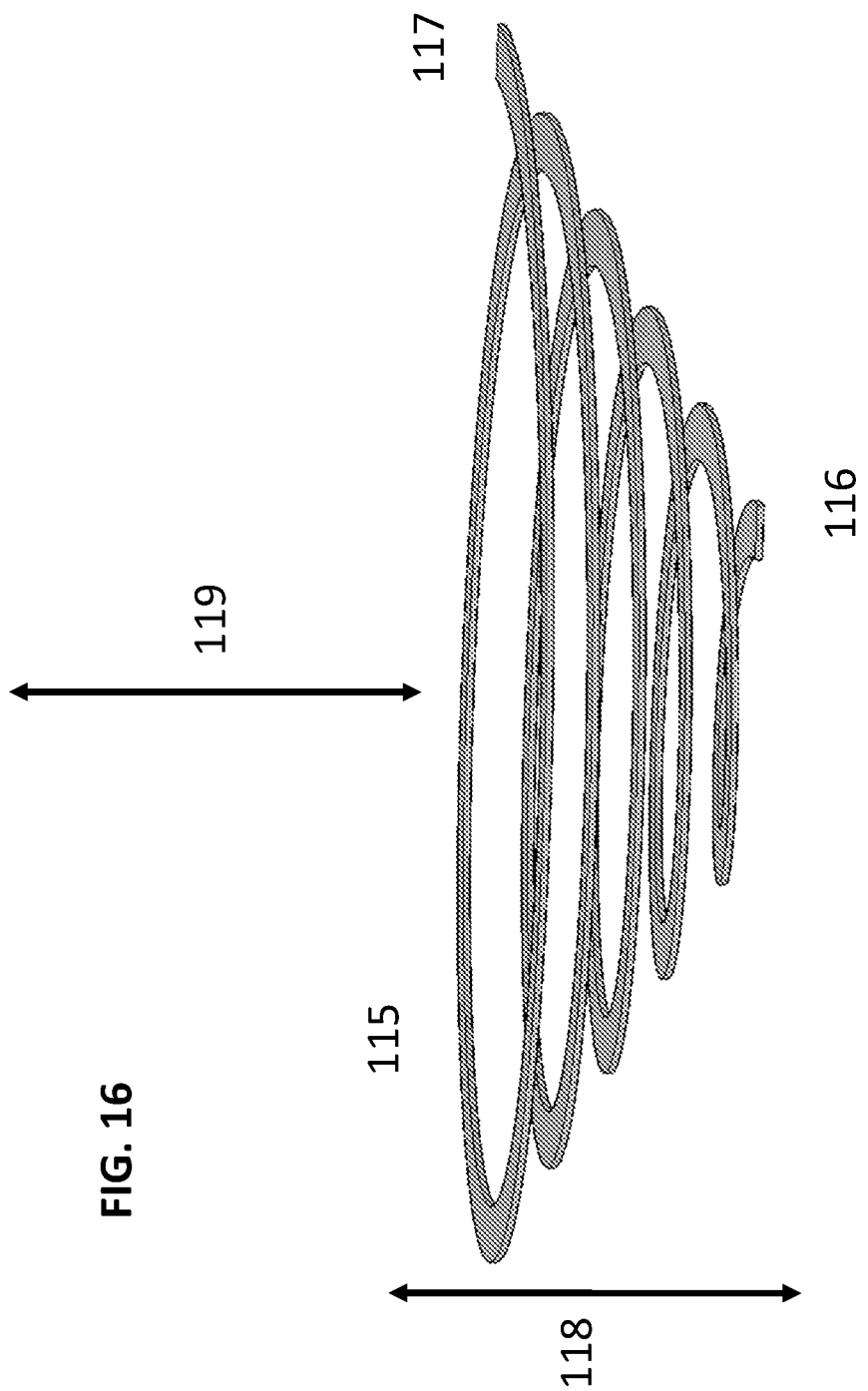
FIG. 16 depicts a 3D embodiment of a spiral inductor.

Furthermore, the optimization of the field as taught herein, is not limited to planar structures such as the spiral inductor. True 3D structures, not planar structures that are stacked, can also exhibit increased field by focusing the field energy. Such an example is shown in FIG. 16. The 3D conical inductor 115 is comprised of an input 116 and an output 117 with the structure distributed over a height of 118. The structure acts as a lens for the EM field by focusing the field along the axis of the structure 119. It will be appreciated by those skilled in the art by manipulating the geometry of the structure, off axis lensing effect can be realized as well as focusing the field at an arbitrarily designed angle.

It will be appreciated by those skilled in the art that one can also change the thickness of the substrate on which the coil is mounted, the width, spacing, and thickness of the traces and ground plane, even remove the ground plane, as well as the substrate and trace material itself to modify the resulting EM field distribution in order to tailor the sensors performance to the intended application.

As taught in KAIN, the effect of sensing is generated by an electromagnetic field rather than a static magnetic field as is the case for typical ferrite loaded eddy current proximity sensors. As such, the proximity sensor as taught herein will respond to both metals as well as dielectric/insulators within the same device. Specifically, if one were to take the preferred embodiment planer coil 4 as taught herein and embed it in an LC oscillator to realize a change in frequency versus proximity of the target, forming a proximity sensor, as is well known in the arts, the sensor would react to both metal targets and insulator targets within the same sensor. A metal target would produce an increase in frequency as the target approaches the sensor face since the inductance is now reduced, while an insulator target will produce a decrease in frequency as the target approaches since the parasitic capacitance of the coil now increases. This can be both advantageous and disadvantageous. If one is unsure of what the target material is, the opposing change in frequency effect is advantageous as the change in frequency is unambiguous for material type. However, if the target is metal and a dielectric material is introduced between the target and sensor face, such as water, the resulting change in frequency will be a combination of both effects and could lead to ambiguity in proximity distance measurement.

Figure 13:
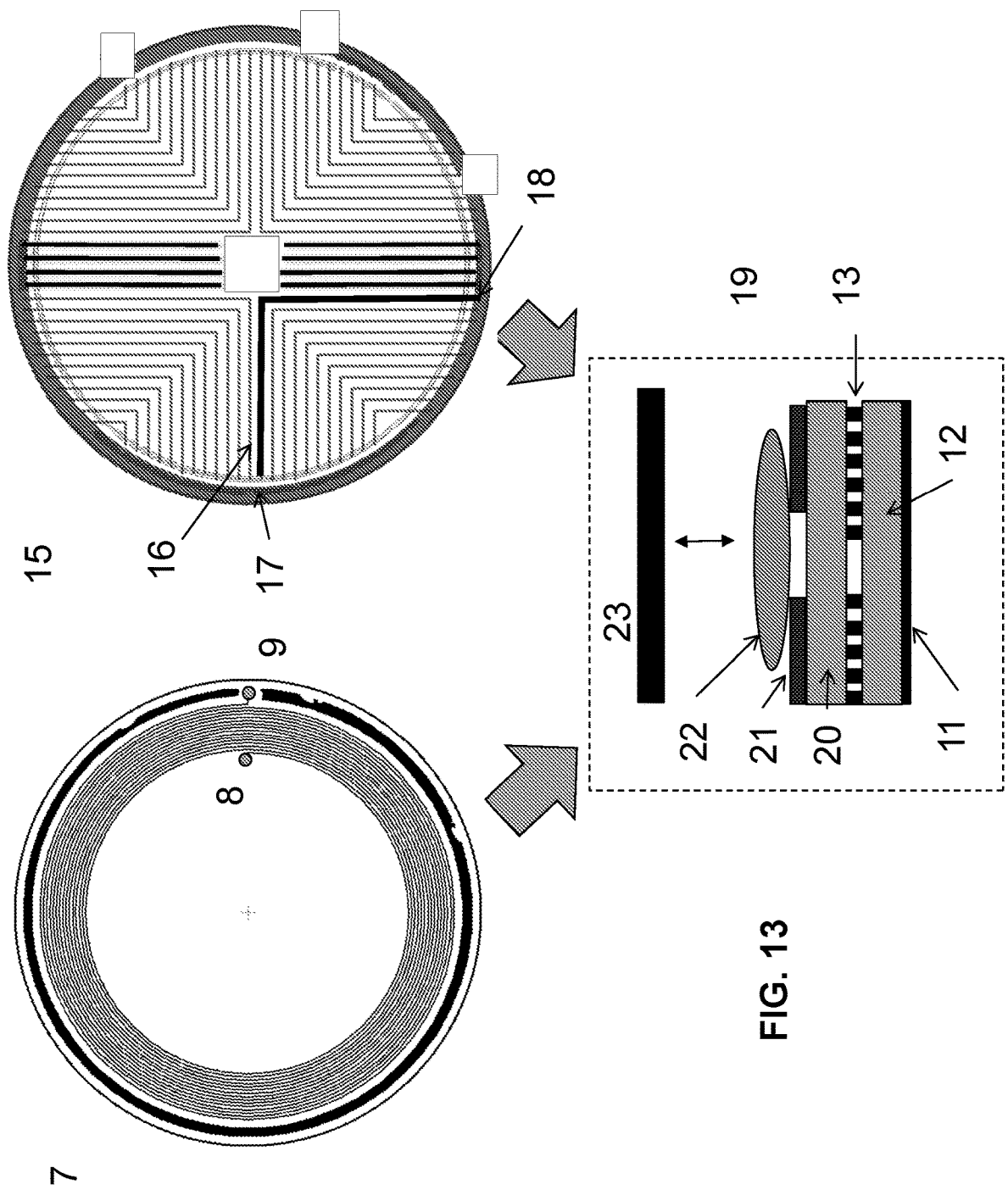
FIG. 13 depicts an E-guard structure and its implementation.

However, we can selectively mitigate the effect of one versus the other by employing selective field suppression structures 103 that reduce either the electric or magnetic field influence within the EM field. One such embodiment is shown in FIG. 13. E-guard 15 printed circuit board (PCB) is comprised of a substrate 20, such as FR4, with a curvilinear pattern 16 made out of metal. The curvilinear pattern consists of a metal trace with an open end 17 and a shorted end 18 which is grounded to the PCB ground 11.

By grounding only one end of the trace 18 while leaving the other end 17 open in this pattern, an effective electric shield is created. Equally as important, a continuous loop between ends is NOT created so no current can flow within the trace, hence no eddy currents can build up on the surface and mask the to be sensed target 23 above the E-guard 15. In this way, the sensor can readily measure the metal target 23 as it approaches and recedes, however, water 22 or any such dielectric material that is in close proximity to the E-guard 15 is effectively shielded as the electric field component of the EM field is greatly reduced due to the metal traces of the E-guard 17 or as depicted in cross section, 21.

Figure 5:
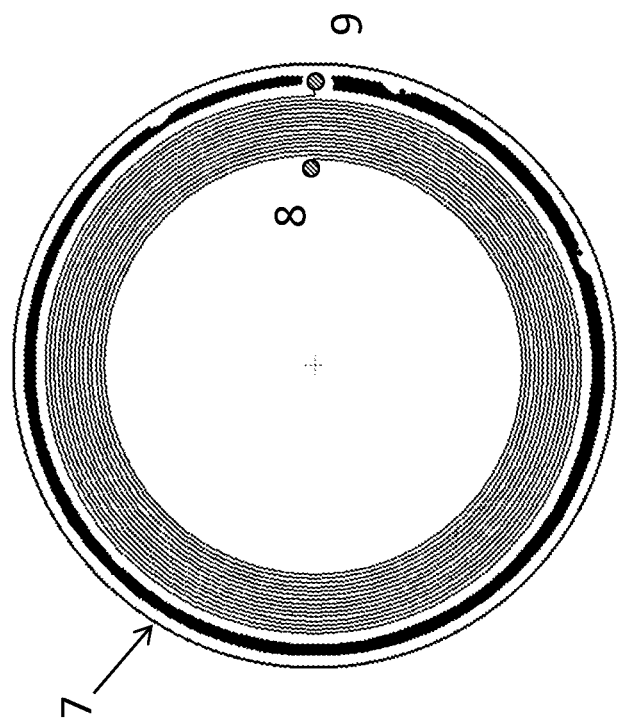
FIG. 5 depicts a cross-sectional view of the enhanced sensing distance structure of Figure

As an application example, the sensor 102 as taught herein of extended range with E-guard 15 could be completely submerged under water. One can think of the E-guard 15 as a meta-material imitating and having the same electrical performance of a high dielectric material. Equally as well, substituting a high dielectric material such as strontium titanate, with a dielectric constant of >130, in place of the E-guard 15 would have the same effect of effectively shielding the sensor from a water environment as water only has a dielectric constant of 80. However, E-guard 15 is much simpler and less costly to manufacture than using an equivalent piece of high dielectric material. It will be appreciated by those skilled in the art that the dual of FIG. 5 is also possible. Specifically, if the target to be sensed is a dielectric material, then E-guard 15 would be converted to I-guard where the chevron pattern is shorted on both ends 17 and 18 allowing a current to flow, hence the term I-guard, thereby suppressing the magnetic portion of the EM field while allowing the electric field portion to interact, and detect, the dielectric target.

The electronics components of the sensor 102 also provide enhanced capabilities as taught herein. By allowing the microcontroller 107 the ability to control both the frequency adjustment 106 and oscillator core 105 elements, many of these advantages are realized. Conventional state of the art proximity sensors suffer from electromagnetic interference compatibility (EMC). The sensors are particularly susceptible to electromagnetic interference (EMI) and cannot function in severe environments, such as where welding is performed, wireless communications occur, or radar is used, except where extraordinary shielding capabilities and electronic mitigation techniques have been built into the sensor. This is because the frequency of the electromagnetic interference (EMI) is directly picked up by either the ferrite loaded bobbin or the planar coil to which the sensing element is tuned. For example if the nominal operating frequency of the ferrite loaded bobbin is 1 MHz, then a 1 MHz EMI signal of sufficient strength will swamp out any effect due to the target presence, as the electronics has no way of distinguishing the interference signal from the actual displacement of the target. However, as taught herein, by operating the sensor at multiple independent frequencies, this EMC issue is eliminated.

Figure 14:
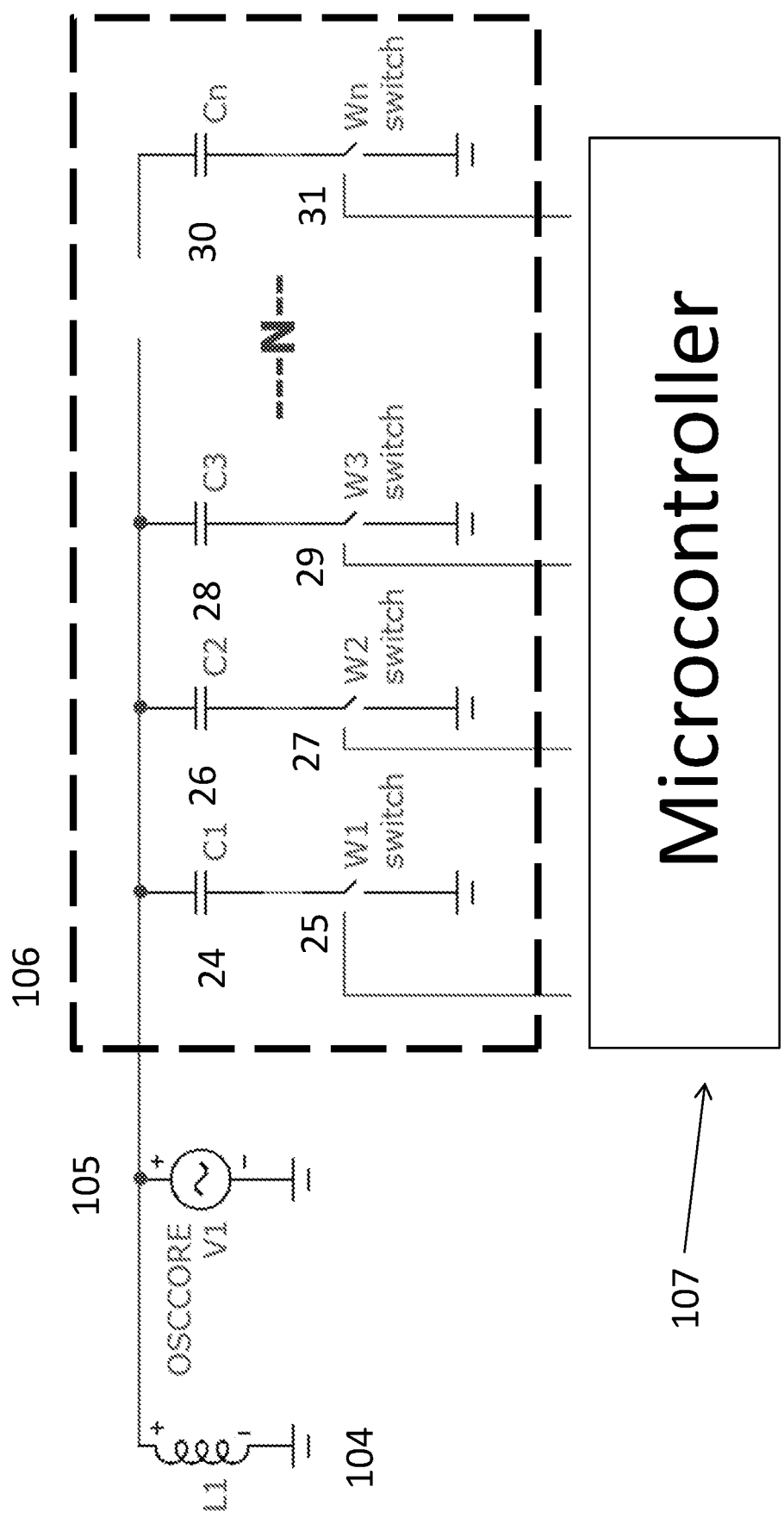
FIG. 14 depicts a schematic diagram showing an embodiment of multi-frequency mode.

For example, let the frequency adjust element 106 be comprised of a switch bank of capacitors as shown in FIG. 14. Each capacitor and EM field responsive component 104 form a frequency dependent element that governs the oscillation frequency of the oscillator core 105. For example capacitor 24 with switch 25 closed by the microcontroller 107 creates an LC oscillator with the frequency determined by the components 24 and 104 according to their values, as is well known in the arts. If, however, capacitor 26 and switch 27 are used instead, with capacitor 26 having a different capacitance value than capacitor 24, a different frequency of oscillation will be realized. Furthermore if both capacitor 24 and 26 and switch 25 and 27 are used at the same time, a still further oscillation frequency will be realized. Of course, these permutations, combinations, and selections of capacitors and switches can be extended across N capacitor and switch combinations up to and including capacitor 30 and switch 31.

Each selection, individually or in combination, is controlled by the microcontroller 107. Equally as important, each combination resulting in a unique frequency of oscillation for that combination will produce its own frequency dependence on the location of the target, for which the sensor has been characterized. In essence, each combination produces its own proximity sensor operating at its nominal frequency. Now imagine EMI at one particular frequency. The proximity sensor tuned to this frequency will be swamped. However, the other proximity sensors, tuned at different frequencies will not be swamped so that the proximity measurement can be taken from them rather than the one effected by the EMI. For example, let's imagine there are 3 operational frequencies that result in 3 proximity measurements at these 3 different frequencies. Microcontroller 107 measures each frequency and corresponding frequency shift due to the target's proximity and sees that frequency 1 measures a target distance at 1 inch, frequency 2 a target at 7 inches, and frequency 3 at 1 inch. It's obvious that frequency 2 has been compromised and the sensor would only consider frequency 1 and frequency 3's values legitimate, and microcontroller 107 would discard frequency 2's value. This multiple measurement by multiple frequency method can be extended to any number of measurement frequencies, so that if EMI occurs at more than 1 frequency simultaneously, the sensor 102 only needs to have more frequency choices for measurement than anticipated EMI interferers*. In this way, EMI effects are virtually eliminated from the sensor as the sensor will choose a frequency for measurement precisely where EMI is not present.

As a specific example illustrating this concept, let the user choose capacitors and switches such that three frequencies are produced; 5, 6, and 7 MHz. Also assume, an undesired EMI interference signal of bandwidth 250 Khz can be generated anywhere between 1 and 10 MHz. As taught herein, if the EMI signal coincides with either 5,6, or 7 MHz that particular frequency cannot be used to measure the target's proximity. However, by definition, if the EMI signal is at 6 MHz with a bandwidth of 250 KHz, it cannot be at 5 MHz or 7 MHz. Hence, the proximity measurement at 5 and 7 MHz is not interfered with and the proximity measurement is legitimate at both those frequencies. Since the measurement at 5 and 7 MHz will agree with each other, and the measurement at 6 MHz will be significantly different due to the EMI signal jamming the measurement, the microcontroller 107 now reject the measurement at 6 MHz in favor of the agreement between the 5 and 7 MHz measurement and reports the correct target distance. But what if the user suspects the interferer to be 1 MHz in bandwidth rather than 250 KHz? In this case the user simply picks capacitors, switches, and combinations thereof so that, in keeping with the 3 frequency measurement example, the proximity transducer operates at 3, 5, and 7 MHz instead. The anti-EMI interference analysis remains the same. Alternatively, let us assume the user is restricted to using components that only give 1 MHz signal differences, so that he must use 5, 6, and 7 MHz It would appear that the EMI interferer of 1 MHz bandwidth will ruin his proximity transducer. However, the user has only to introduce other frequencies by either adding more capacitive and switch components or combinations thereof. For example he may add components so that the sensor now operates at 6 frequencies 3, 5, 6, 7, 11, 13 MHz; the anti-EMI strategy of multiple frequencies for multiple measurements remains the same. This multiple frequency/multiple measurement concept can also be extended to anti-jamming and anti-hacking of the sensor. In order to jam the sensor 102, an interference agent would have to cover all possible frequencies of operation of the sensor 102. Let us assume this is the case. One would then simply add more capacitive switches to sensor 102 resulting in new non-jammed frequencies to the sensor design and eliminate the jamming/hacking threat. At some point, the broad band energy requirement needed by the jammer/hacker will be too large, expensive, and difficult to manage, while the sensor only needs to add a couple more switching capacitor combinations to avoid the jamming/hacking.*

Furthermore, by employing well know frequency hopping techniques, such as found in spread spectrum communications, a spread spectrum proximity sensor* is realized that has a unique signature allowing multiple sensors to be used in the same way as current cellphones and wireless and wireline communications equipment is used. The unique signature is achieved as follows. Every sensor that is built will always have some tolerance associated with the physical building and operation of the device. Components are never identical to each other so that one sensor might have one of its operating frequencies at 5.003 MHz, while another sensor might be at 5.0025 MHz for the same nominal component. Using the multiple frequency design as taught herein, the more frequencies used in the device the more the variation in frequencies across many devices. As such each device has its own "fingerprint" of precise frequency hopping values, not only in the frequency themselves, but in relationship to the frequency deviation between each hop and the sequence in totality. As such, by the stochastic nature of each sensor that is built, simply cloning the data that the sensor produces, such as its ID number, is not enough to hack the sensor, since one would have to also mimic the "fingerprint" of the sensors frequency operation, which is impossible as the frequency operation is probabilistic, not deterministic, in nature. This allows for the building of a secure sensor network by virtue of employing the basic multiple frequency/multiple measurement method as taught herein, combined with well-known frequency hopping based communications techniques, combined with each sensors unique "fingerprint" of frequency operation. As each sensor is independent and unique as far as the overall system is concerned, sensors can readily be added to and subtracted from the overall system; all the sensors do not need to be in communication with each other or even operable for this secure sensor system to function properly.

Figure 15:
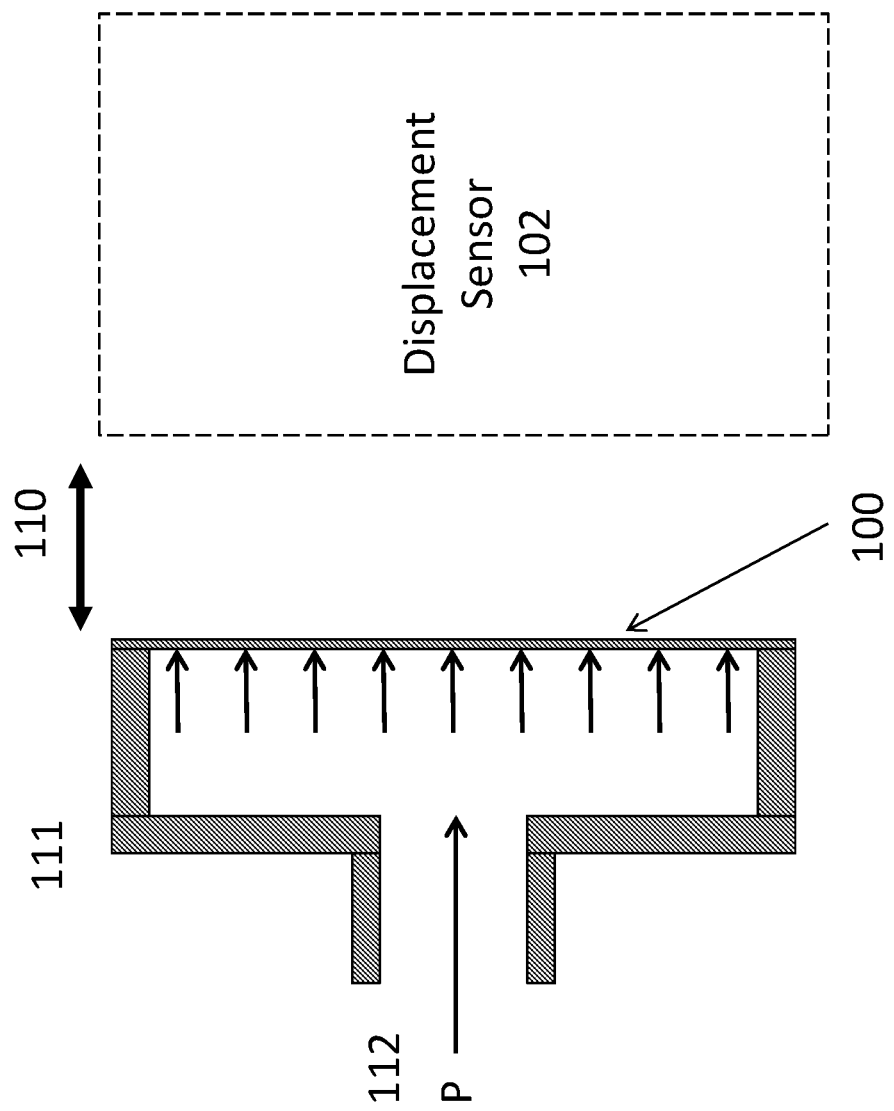
FIG. 15 depicts the use of the enhanced sensing distance structure in a pressure sensor.

The sensor 102 as taught herein operates by measuring the displacement of target 100. As previously indicated, sensor 102 does not care how that target 100 is displaced; it only measures the displacement, not the cause of the displacement. As such, as taught herein, the displacement sensor 102 can be modularly combined with mechanical structures that limit the displacement of the target*. In this way, numerous physical parameter sensors can be realized using the sensor 102 as taught herein, and appropriate mechanical structures that allow the target to displace in a proscribed manner, such as, but not limited to, pressure sensors, force sensors, load cells, torque sensors, flow sensors, level sensors, etc. as will be appreciated by those skilled in the art. FIG. 15 is an embodiment of an exemplary pressure sensor that demonstrates and highlights the invention as taught herein.

Pressure structure 111 allows for pressure to enter the structure via opening 112. The entire structure 111 is held at a fixed distance 110 from sensor 102. This fixed distance can be achieved, but is not limited to, securing 111 to 102 with screw, epoxy, welding, and/or any suitable means of attachment that establishes a relative fixed position between the sensor 102 and the target 100. As pressure builds in 111 a mechanically suitable designed target 100 will deflect with the increasing pressure. As such, the relative displacement between target 100 and sensor 102 will change thereby resulting in a change in output of sensor 102 as taught herein. This, therefore, allows the combination of 102 and 111 to form a pressure sensor rather than the simple displacement sensor of 102 alone. It will be appreciated by those skilled in the art that the mechanical matching of structures such as 111 and sensor 102 will give rise to a variety of physical parameter type sensors, as indicate above. This modular approach of mating controllable displaced targets 100 through physical parameter stimuli and the core displacement sensor 102 results in the rapid development of multi-discipline sensor capabilities all riding on a common core sensing principle. *

The extension of this principle to other physical parameter sensors is shown in FIG. 9. The preferred embodiment shown in FIG. 1 is repeated here in the center of FIG. 9; that of the core sensor 102 and the target 100 that is in proximity to the sensor 102. As taught herein, by modularly changing the mechanical structure that makes up the "target" multiple sensors can be realized using the same core sensor 102.

Figure 17:
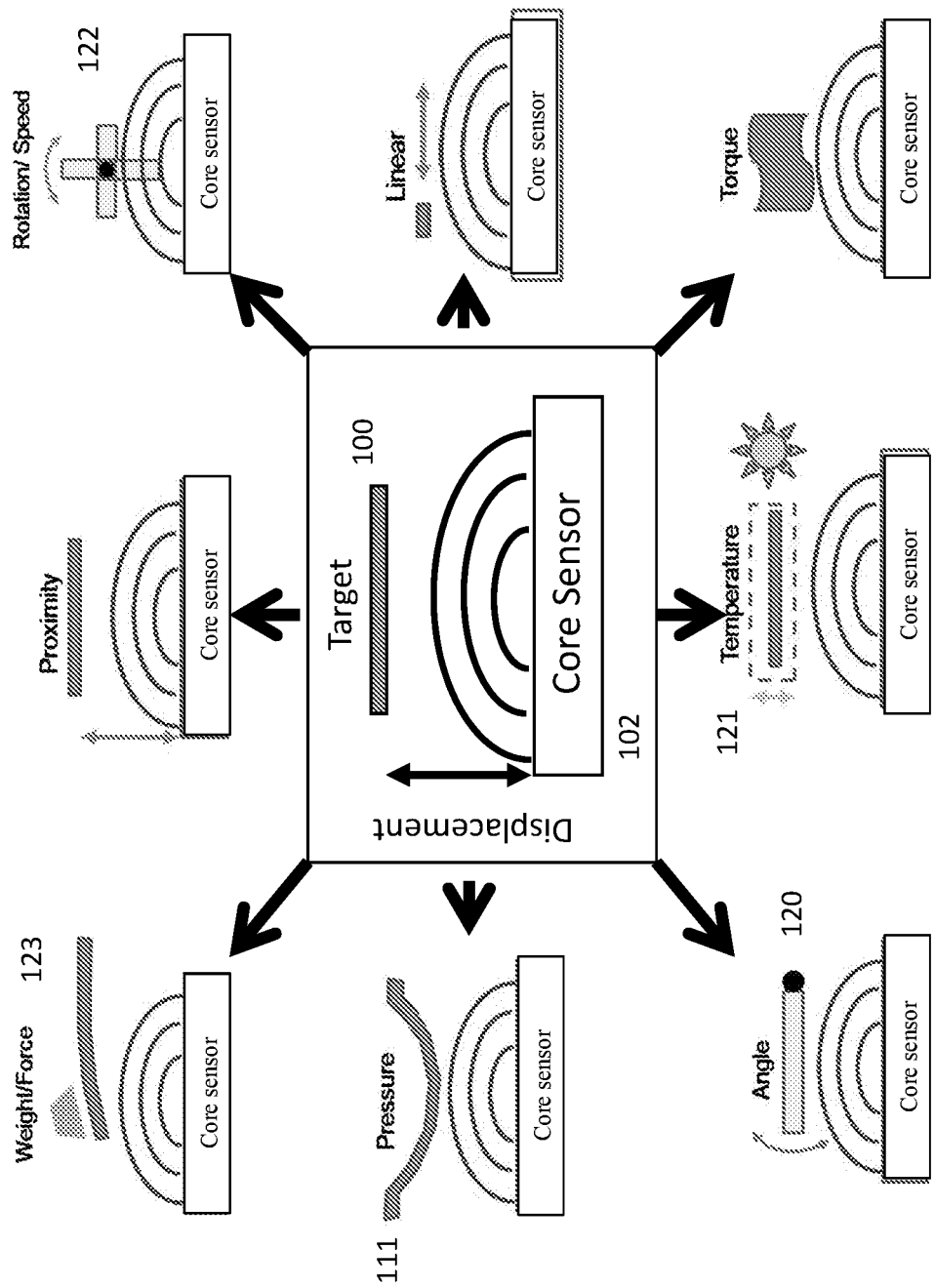
FIG. 17 depicts the modular sensor principle extended to other types of physical parameter sensors.

As depicted in FIG. 17, many more types of sensors can be realized by simply modifying the "target" in relation to the core sensor 102. FIG. 16 depicts 8 types of sensors derived from this principle. It will be appreciated by those skilled in the art that there are numerous other sensors types that can be realized using the principles taught herein.

For example, a load cell can be realized by constraining the target movement to a prescribed displacement, such as making the target 123 into a cantilever beam. By placing a weight or load onto the cantilever beam 123, the "target" will now displace according to the spring constant of the beam as is well known in the arts. This restricted displacement is sensed by the core sensor 102 and results in a sensor that displaces a restricted moving cantilever beam whose displacement is realized by placing a weight on said cantilever beam.

Hence, a load cell is realized by the modular combination of the core sensor 102 and the cantilever beam "target" 123. Similarly, the embodiment of FIG. 15 is shown as the canonical pressure diaphragm 111 coupled to the core sensor. Also, the "target" can be restricted to angular motion resulting in an angular sensor 120. If the target is held fixed but is comprised of a bi-metallic structure 121, than the "target" will displace in accordance with a change in temperature; hence a temperature sensor is realized with the combination of target 121 and core sensor 102. If the target is constrained to rotational motion 122 so that any vanes rotate towards/away from the core sensor 102 than a rotation or inclinometer sensor is realized. As will be appreciated by those skilled in the arts this continued modular development of a mechanically constrained "target"'s displacement being sensed by the core sensor 102 results in numerous types of sensors only limited by imagination and design of the user.

The invention claimed is:

1. A displacement measuring transducer for sensing a displacement of a physical component, the displacement measuring transducer comprising:
   at least one electrical component structure that produces an electromagnetic field in response to an applied radio frequency signal, wherein the electromagnetic field extends from the at least one electrical component structure significantly beyond a range of a conventional electrical component structure of similar design topology for the same or similar displacement measuring purpose
   a monitoring circuit for monitoring an output signal affected by the electromagnetic field and detecting an operation of the at least one electrical component structure according to a change in an output signal, the detected operation indicating the displacement of the physical component;
      wherein the physical component is positioned relative to the at least one electronic component structure such that the physical component perturbs the electromagnetic field without physically contacting the at least one electronic component structure.

2. The displacement measuring transducer according to claim 1, wherein the at least one electrical component structure comprises:
   a substrate;
   a single or plurality of spiral inductors formed on one or both sides of the substrate.

3. The displacement measuring transducer according to claim 1, further comprising:
   an electronic guard for shielding an electronic field component of the electromagnetic field, the electronic guard comprising:
      a plurality of metal traces arranged in a curvilinear pattern a defined distance above the top of the at least one electrical component structure;
      wherein first ends of the plurality of metal traces are connected to a common shared ground of the at least one electrical component structure; and
      wherein second ends of the plurality of metal traces are not connected to the common shared ground of the at least one electrical component structure to prevent current flow in the plurality of metal traces.

4. The displacement measuring transducer according to claim 1, further comprising:
   a magnetic guard electronic guard for shielding a magnetic field component of the electromagnetic field, the magnetic guard comprising:
   a plurality of metal traces arranged in a curvlinear pattern a defined distance above the top of the electrical component structure;
      wherein first ends of the plurality of metal traces are connected to a common shared ground of the electrical component structure; and
      wherein second ends of the plurality of metal traces are also connected to a common shared ground of the electrical component structure to allow current flow in the metal traces.

5. The displacement measuring transducer according to claim 1, further comprising:
   an oscillator for causing the at least one electrical component structure to produce the electromagnetic filed;
   a frequency adjustment circuit; and
   a microcontroller for adjusting a frequency of the oscillator using the frequency adjustment circuit.

6. The displacement measuring transducer according to claim 5, wherein the frequency adjustment circuit comprises:
   a plurality of different electrical components in series with a plurality of switches,
   wherein the microcontroller varies an opening and a closing of the plurality of switches to vary the frequency of the oscillator, and
   wherein the plurality of different electrical components comprise resistors, capacitors, inductors, active and passive semiconductor devices.

7. The displacement measuring transducer according to claim 1, wherein the at least one electrical component structure comprises:
   a plurality of electromagnetic field responsive components stacked up using a predefined separation between the plurality of electromagnetic field responsive components,
   wherein the plurality of electromagnetic field responsive components are electrically connected either in series or parallel to each other, and
   wherein the plurality of electromagnetic field responsive components are arranged so that currents or voltages remain in phase between the plurality of electromagnetic field responsive components, 180 degrees out of phase, or some intermediate determined phasing in order to affect a desired electromagnetic field response.

8. The electrical component structure of claim 1, further comprising:
   wherein the at least one electromagnetic field responsive component is selected from the group including planar structures that include spiral inductors, meander inductors, planar transformers, interdigitated capacitors, quasi-TEM transmission line structures including microstrip, coplanar waveguide, and non-planar structures that include waveguides, dielectric waveguides and resonators, and planar structures that conformally coat 3D structures.

9. The displacement measuring transducer according to claim 1, further comprising:
   an oscillator for causing the at least one electrical component structure to produce an electromagnetic sensing field;
   a frequency adjustment circuit; and
   a microcontroller for adjusting a frequency of the oscillator using the frequency adjustment circuit,
   wherein the displacement measuring transducer:
      measures the displacement of the physical object at a plurality of different frequencies by adjusting the frequency of the oscillator; and
      rejects any displacement measurements not within a predetermined range of each other.

10. The displacement measuring transducer according to claim 1, wherein the electrical components sensing range and/or sensing sensitivity is at least 2 times the sensing range and/or sensitivity of a similarly designed conventional electrical component of the same topology.

11. The displacement measuring transducer according to claim 1, wherein a thickness to a sensing face surface area ratio of the at least one electrical component structure is less than or equal to 0.1.

12. The displacement measuring transducer according to claim 1, wherein a linewidth to linespacing ratio of the at least one electrical component structure is less than or equal to 0.5.

13. The displacement measuring transducer according to claim 1, wherein >50% of electrical current in the at least one electrical component is located towards a periphery of the structure of the at least one electrical component structure.

14. A modular sensing system for measuring displacement of a physical object, the modular sensing system comprising:
   an oscillator for producing an electromagnetic field;
   a frequency adjustment circuit for controlling a frequency of the electromagnetic field;
   an electromagnetic field responsive component; and
   a microcontroller for sampling an output of the electromagnetic field responsive component,
   wherein at least one end of the physical object is immovably located a fixed distance from the electromagnetic field responsive component.

15. The modular sensing system according to claim 14, wherein the physical object is metal, semiconductor, or insulator.

16. The modular sensing system according to claim 14, wherein the sensing device is selected from the group of physical parameter sensors and transducers, but not limited to, load cells, pressure sensors, pressure switches, accelerometers, proximity sensors, proximity switches, weighing sensors, linear displacement sensors, angular displacement sensors, linear encoders, velocity meters, viscosity meters, flow meters, temperature sensors, conductivity sensors, chemical sensors, extensometers, force sensors, seismometers, geotechnical sensors, and multi-discipline sensors.

17. A method for accurately measuring displacement of a physical object using a displacement measurement transducer in the presence of an electromagnetic jamming signal, the method comprising:
   producing an electromagnetic sensing field using an oscillator;
   adjusting a frequency of the oscillator using a microcontroller;
   measuring a displacement of the physical object at a plurality of different frequencies by adjusting the frequency of the oscillator;
   rejecting any displacement measurements not within a predetermined range of each other as being affected by the electromagnetic jamming signal; and
   outputting a final displacement measurement of the physical object.

18. The method according to claim 17, wherein the adjusting the frequency of the oscillator comprises:
   opening and a closing a plurality of switches to vary the frequency of the oscillator,
   wherein the plurality of switches are in series with a plurality of different electrical components.

19. The method according to claim 17, wherein the adjusting the frequency of the oscillator comprises, wherein the electrical components sensing range and/or sensing sensitivity is at least 2 times the sensing range and/or sensitivity of a similarly designed conventional electrical component of the same topology.

* * * * *